United States Patent
Kayano

(10) Patent No.: US 7,840,196 B2
(45) Date of Patent: Nov. 23, 2010

(54) FILTER CIRCUIT AND RADIO COMMUNICATION SYSTEM COMPRISING FILTER

(75) Inventor: Hiroyuki Kayano, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1006 days.

(21) Appl. No.: 11/534,069

(22) Filed: Sep. 21, 2006

(65) Prior Publication Data

US 2007/0149159 A1    Jun. 28, 2007

(30) Foreign Application Priority Data

Dec. 23, 2005  (JP) .............................. 2005-371127

(51) Int. Cl.
  *H01Q 11/12* (2006.01)
  *H04B 1/18* (2006.01)
  *H04B 17/00* (2006.01)
  *H01P 7/00* (2006.01)

(52) U.S. Cl. ..................... 455/125; 455/193.2; 455/266; 455/307; 333/235

(58) Field of Classification Search .................. 455/78, 455/114.1, 114.2, 120, 121, 125, 193.1, 193.2, 455/280, 286, 296, 307, 266; 333/99 S, 167, 333/175, 176, 219, 219.1, 235

See application file for complete search history.

(56) References Cited

U.S. PATENT DOCUMENTS

| | | | |
|---|---|---|---|
| 6,518,854 B2 * | 2/2003 | Kayano et al. ............. | 333/99 S |
| 6,759,930 B2 | 7/2004 | Kayano et al. | |
| 6,870,445 B2 | 3/2005 | Kawakubo et al. | |
| 2002/0186757 A1 * | 12/2002 | Nakamura et al. .......... | 375/219 |
| 2004/0036558 A1 * | 2/2004 | Allison et al. ............... | 333/205 |
| 2004/0041635 A1 | 3/2004 | Sano et al. | |
| 2005/0285701 A1 | 6/2005 | Kayano et al. | |

FOREIGN PATENT DOCUMENTS

| | | |
|---|---|---|
| JP | 3-72701 | 3/1991 |
| JP | 2000-30594 | 1/2000 |
| JP | 2001-345601 | 12/2001 |
| JP | 2003-532322 | 10/2003 |
| JP | 2004-112378 | 4/2004 |
| JP | 2004-128738 | 4/2004 |
| JP | 2004-243462 | 9/2004 |
| JP | 2005-79604 | 3/2005 |
| JP | 2005-86469 | 3/2005 |
| JP | 2005-136588 | 5/2005 |

(Continued)

OTHER PUBLICATIONS

U.S. Appl. No. 11/534,368, filed Sep. 22, 2006, Kayano.

(Continued)

*Primary Examiner*—Nguyen Vo
(74) *Attorney, Agent, or Firm*—Oblon, Spivak, McClelland, Maier & Neustadt, L.L.P.

(57) ABSTRACT

In a filter circuit, resonators is connected in parallel between input and output terminal, an input signal is input through the input terminal and supplied to the resonators. Signal generators are connected to the resonators to control the resonators. The signal generators are controlled by a control unit so that the resonators are resonated to generate resonance signals at different resonant frequencies and at predetermined resonance phases. Thus, the output signal is set within a desired frequency range.

8 Claims, 11 Drawing Sheets

FOREIGN PATENT DOCUMENTS

| | | |
|---|---|---|
| JP | 2005-192146 | 7/2005 |
| WO | WO 2004/068731 A2 | 8/2004 |
| WO | WO 2005/122390 A2 | 12/2005 |

OTHER PUBLICATIONS

U.S. Appl. No. 11/477,435, filed Jun. 30, 2006, Hiroyuki Kayano.

Mitsuru Honjoh, et al., "Synthesis of Microwave Circuits by Normal Mode Expansion-Synthesis of Rectangular Waveguide Filter with Dielectric Sheet Window", IEICE Technical Report (Japanese), MW 82-54, 1982, pp. 9-16.

James Brank, et al., "RF MEMS-Based Tunable Filters", International Journal of RF and Microwave Computer-Aided Engineering, vol. 11, Issue 5, Sep. 2001, pp. 276-284.

Japanese Office Action issued on Aug. 17, 2010, with English translation (11 pages).

\* cited by examiner

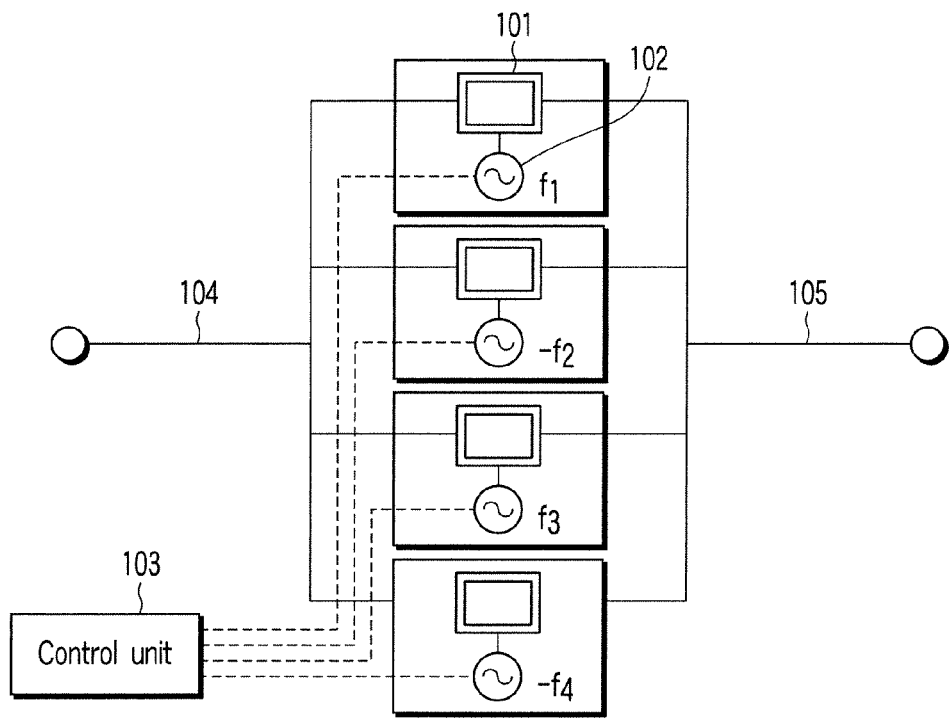
F I G. 1
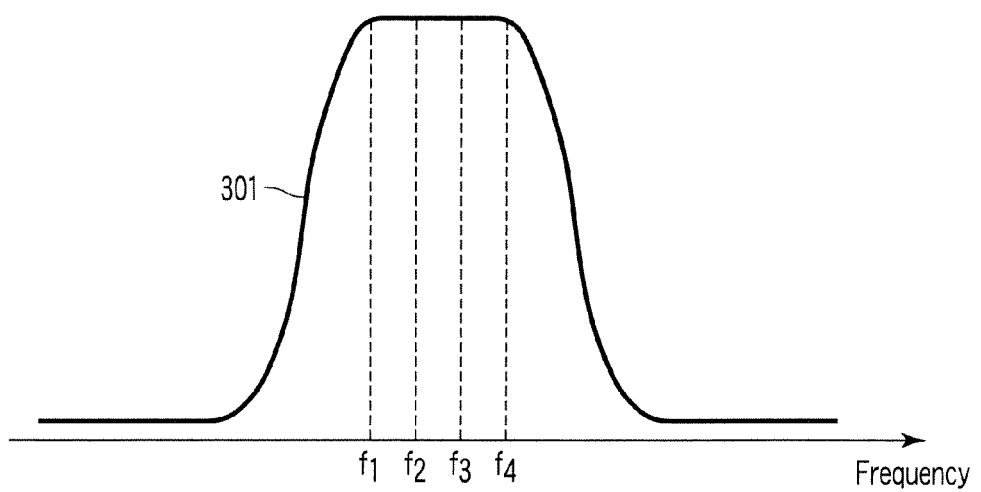
F I G. 2

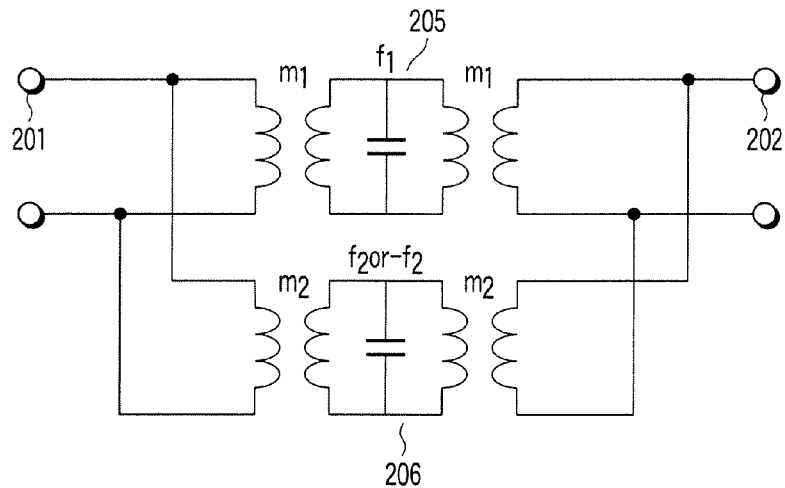
F I G. 3
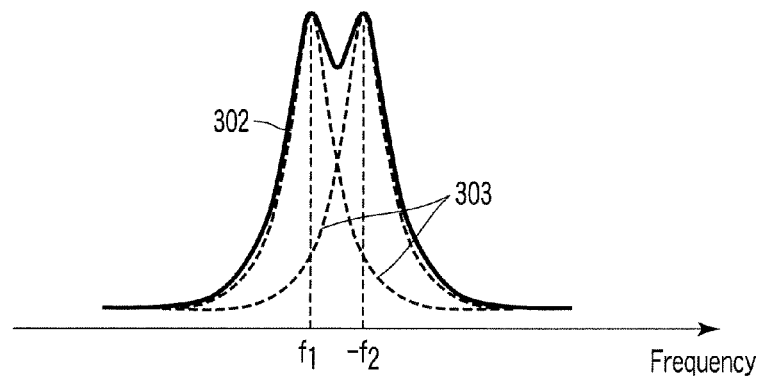
F I G. 4
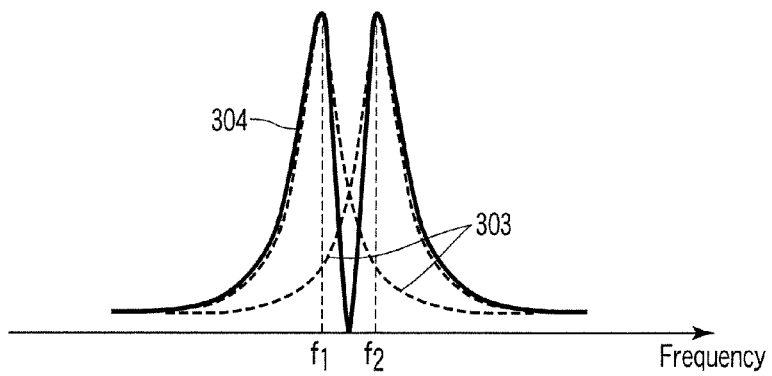
F I G. 5

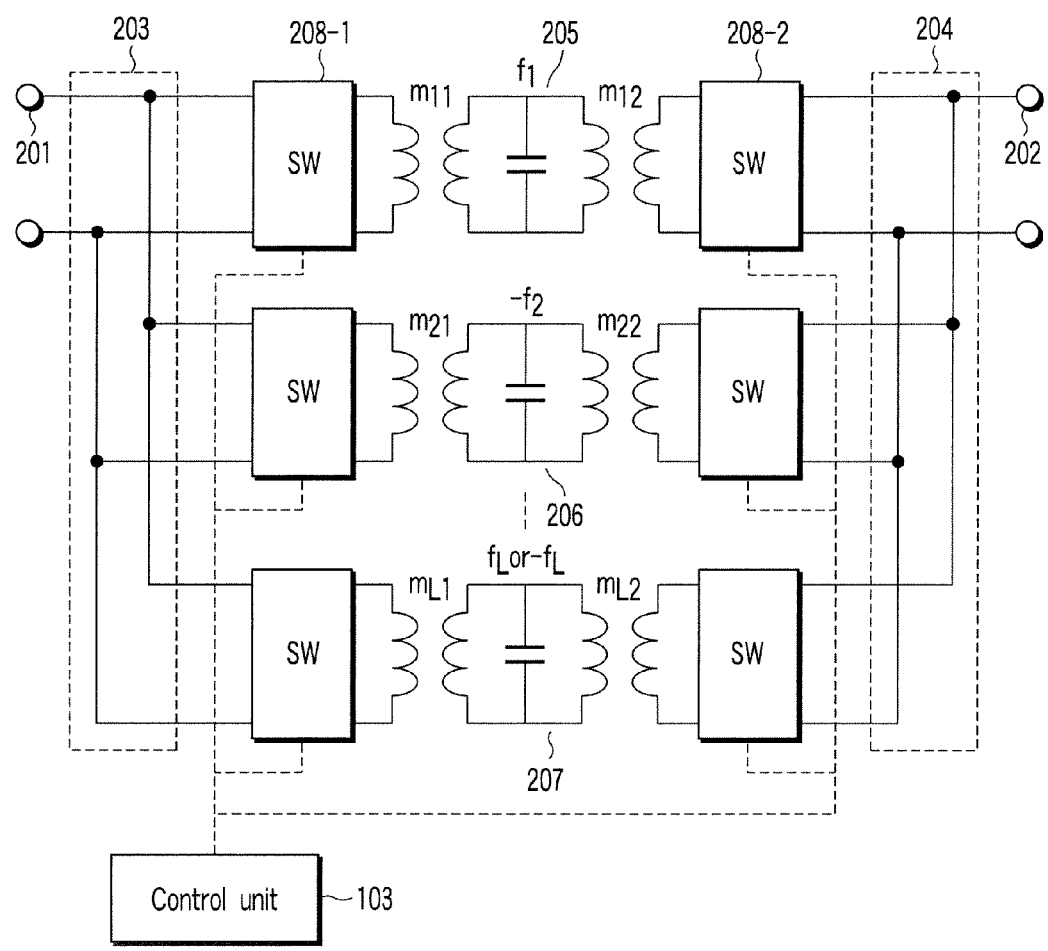
F I G. 12

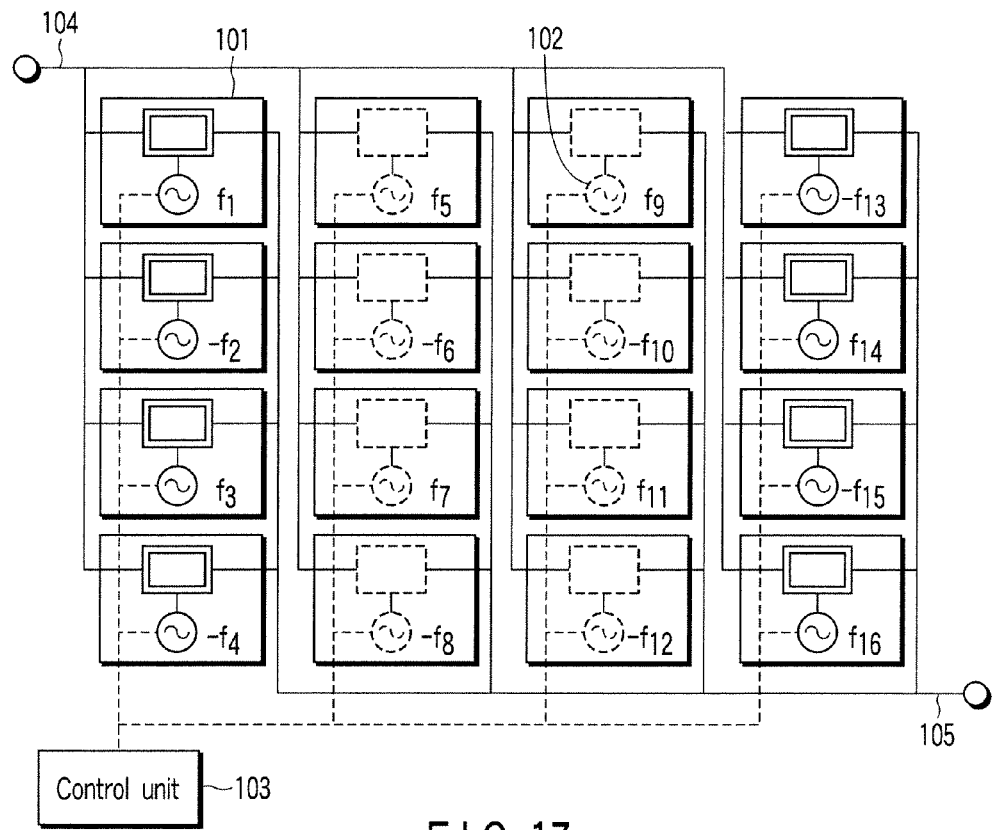
F I G. 17
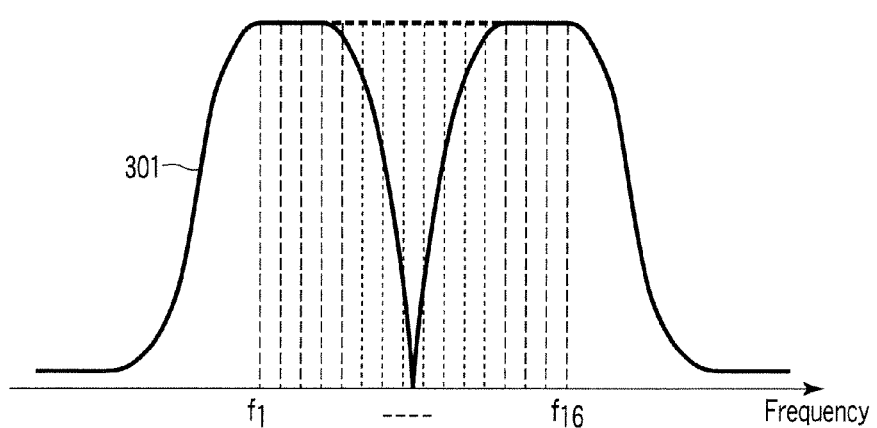
F I G. 18

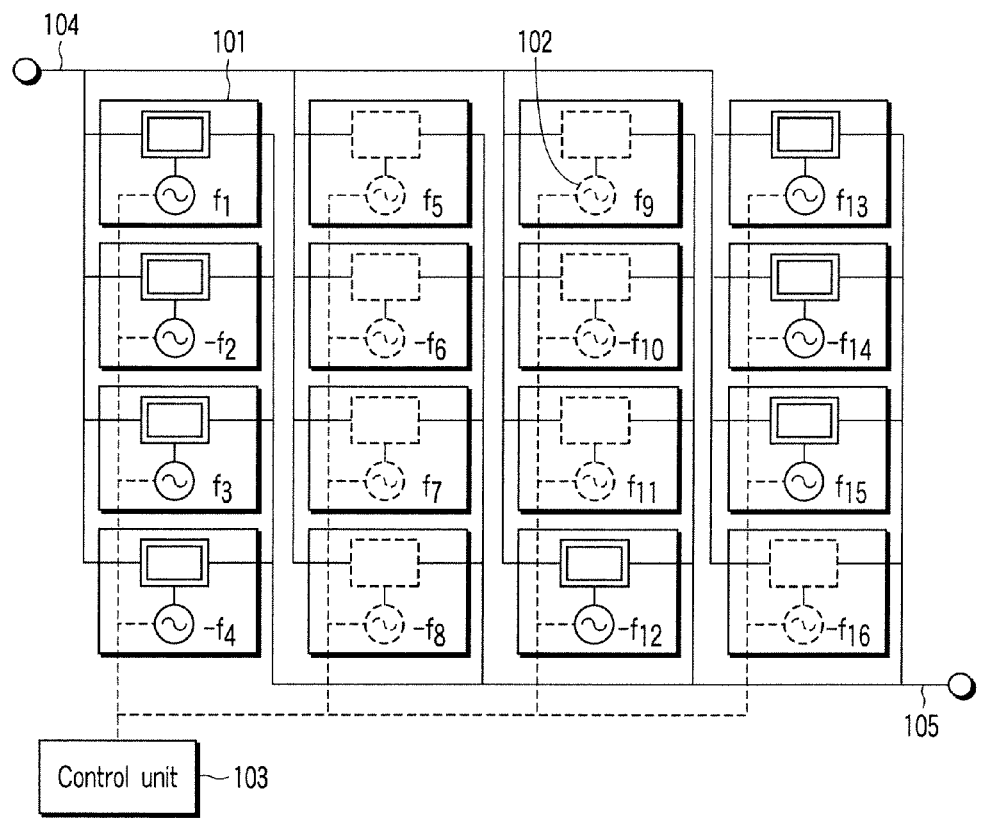
F I G. 19
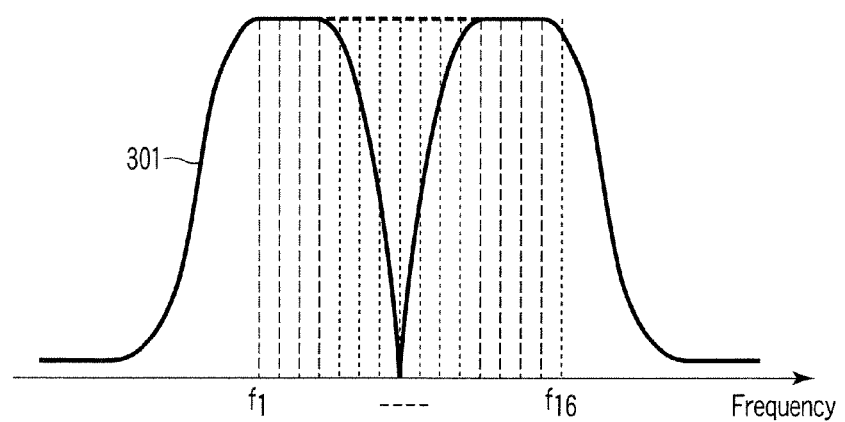
F I G. 20

FILTER CIRCUIT AND RADIO COMMUNICATION SYSTEM COMPRISING FILTER

CROSS-REFERENCE TO RELATED APPLICATIONS

This application is based upon and claims the benefit of priority from prior Japanese Patent Application No. 2005-371127, field Dec. 23, 2005, the entire contents of which are incorporated herein by reference.

BACKGROUND OF THE INVENTION

1. Field of the Invention

The present invention relates to a filter circuit and a radio communication system comprising a filter, and in particular, to an MEMS filter circuit that limits a frequency band and a wireless device comprising this MEMS filter.

2. Description of the Related Art

A known filter circuit has resonance circuits cascaded (connected together in series) between an input terminal and an output terminal as disclosed in James Brank et al., "RF MEMS-based tunable filters," International Journal of RF and Microwave Computer-Aided Engineering, Vol. 11, Issue 5, pp. 276-284, September 2001. In general, an equivalent circuit such as a resonance circuit is formed by an inductor L and a capacitor C, and a resistor is added to the equivalent circuit taking a possible loss in the filter circuit into account. The resonance frequency of a resonance circuit without any resistor is given by:

$$f0 = 1/\mathrm{sqrt}(L*C)$$

where L and C denote the inductance and capacitance, respectively, of the resonance circuit.

For a filter circuit composed of cascaded resonance circuits, the passing frequency range and inhibition area attenuation can be determined by appropriately setting values for the coupling coefficients (m2 and m3) of resonators which represent the amount of coupling among the resonance circuits and for external Qs (m1 and m4) representing the amounts by which an input and output units excite the resonance circuit.

An actual filter circuit is composed of a microwave circuit, a distributed constant circuit, or a lumped constant circuit. A resonance circuit composed of a microwave circuit has a filter composed of a metal cavity or a dielectric placed in a metal cylinder. A filter circuit composed of a distributed constant circuit is composed of a resonance circuit made of microstrip lines or two-dimensional wires. A filter circuit composed of a lumped constant circuit is composed of a constant circuit such as an inductor or a capacitor. In general, the size of the filter may decrease in order of the microwave circuit, distributed constant circuit, or lumped constant circuit. However, the amount of loss in the filter circuit increases with decreasing filter size. In a filter circuit composed of cascaded resonators, energy must pass through all resonance circuits. Accordingly, to reduce a possible loss, circuit scale is increased to provide a resonance circuit with a reduced loss.

A known method of constructing a filter circuit in which signal energy does not pass through all resonance circuits is parallel connection of resonance circuits disclosed in, for example, The Institute of Electronic Information and Communication Engineers: MW82-54. In a filter circuit thus having resonance circuits arranged in parallel, input power is distributed to each resonance circuit. Signal energy may thus suffer a passing loss in only one resonator, thus making it possible to reduce the loss of the filter as a whole. To allow resonators to be connected together in parallel, filter characteristics are obtained by configuring the resonators so that they have different resonance frequencies and detecting and synthesizing input signals so that the resonators having adjacent resonance frequencies output signals of opposite phases.

However, implementation of such a filter circuit conventionally requires opposite phase detecting means or opposite phase synthesizing means using a delay circuit such as the one disclosed in JPA-2001-345601 (KOKAI). This is because the conventional filter circuit uses a free vibrator to cause resonance. If a filter circuit is made on a semiconductor, it is difficult to build opposite phase detecting means in the filter circuit. Provision of a delay circuit is also disadvantageous in terms of a loss. Further, in addition to the resonance frequencies of the resonators, coupling coefficients need to be varied in order to adjust center frequency or bandwidth included in filter characteristics. A mechanism for varying these parameters is disadvantageously complicated. If a common Chevyshev filter is composed of k (integer) resonators, (2k+1) parameters need to be adjusted. A larger number of parameters need to be adjusted for an elliptic function filter circuit or the like which involves more complicated coupling.

As described above, in a filter circuit composed of cascaded resonance circuits, signals pass through the large number of resonance circuits, resulting in too long a signal path and a heavy loss. Further, to vary the center frequency or bandwidth, included in the filter characteristics, many parameters need to be varied, thus disadvantageously requiring a complicated control mechanism.

BRIEF SUMMARY OF THE INVENTION

According to a first aspect of the present invention, there is provided a filter circuit comprising:

input terminals to which an input signal is input;

output terminals which output an output signal;

resonators connected in parallel between the input and the output terminals, to which the input signal is supplied;

signal generators, connected to the resonators, respectively, configured to generate control signals to control the resonators, individually and resonate the resonators; and a control unit configured to control the signal generators to generate resonance signals from the resonators, at different resonance frequencies and at predetermined resonance phases, respectively so that the output signal is set within a desired frequency range.

According to a second aspect of the present invention, there is provided a filter circuit comprising:

input terminals to which an input signal is input;

output terminals which output an output signal;

resonators connected in parallel between the input and output terminals, to which the input signal is supplied and which are resonated at different resonance frequencies and at predetermined resonance phases, respectively;

switching units which switch the respective resonators between an operative state and an inoperative state; and a control unit configured to control the switching units to generate resonance signals from the resonators so that the output signal is set within a desired frequency range.

According to a third aspect of the present invention, there is provided a radio communication device comprising:

an amplifier configured to amplify a high frequency signal;

a mixer which carries out frequency conversion;

an antenna; and a filter circuit connected between the amplifier and the mixer and the antenna and comprising:

input terminals to which an input signal is input;
output terminals which output an output signal;
resonators connected in parallel between the input and the output terminals, to which the input signal is supplied;
signal generators, connected to the resonators, respectively, configured to generate control signals to control the resonators, individually and resonate the resonators; and
a control unit configured to control the signal generators to generate resonance signals from the resonators, at different resonance frequencies and at predetermined resonance phases, respectively so that the output signal is set within a desired frequency range.

According to a fourth aspect of the present invention, there is provide a radio communication comprising:
a amplifier which amplifies a high frequency signal;
a mixer which carries out frequency conversion;
an antenna; and
a filter circuit connected between the amplifier and the mixer and antenna and comprising:
input terminals to which an input signal is input;
output terminals which output an output signal;
resonators connected in parallel between the input and output terminals, to which the input signal is supplied and which are resonated at different resonance frequencies and at predetermined resonance phases, respectively;
switching units which switch the respective resonators between an operative state and an inoperative state; and
a control unit configured to control the switching units to generate resonance signals from the resonators so that the output signal is set within a desired frequency range.

BRIEF DESCRIPTION OF THE SEVERAL VIEWS OF THE DRAWING

FIG. 1 is a circuit diagram schematically showing a filter circuit in accordance with an embodiment;
FIG. 2 is a graph showing the frequency response characteristic of the filter circuit shown in FIG. 1;
FIG. 3 is a simplified circuit diagram showing a circuit configuration to illustrate the operational principle of the filter circuit shown in FIG. 1;
FIG. 4 is a graph showing the frequency response characteristic of the filter circuit shown in FIG. 3 and which performs an opposite phase operation;
FIG. 5 is a graph showing the frequency response characteristic of the filter circuit shown in FIG. 3 and which performs an in-phase operation;
FIG. 12 is a circuit diagram schematically showing a filter circuit in accordance with a variation of the filter circuit shown in FIG. 9;
FIG. 17 is a circuit diagram showing another example of an operation of the filter circuit shown in FIG. 13;
FIG. 18 is a graph showing the frequency response characteristic of the filter circuit shown in FIG. 17;
FIG. 19 is a circuit diagram showing yet another example of an operation of the filter circuit shown in FIG. 13;
FIG. 20 is a circuit diagram showing another example of an operation of the filter circuit shown in FIG. 19.

DETAILED DESCRIPTION OF THE INVENTION

Figure 6:
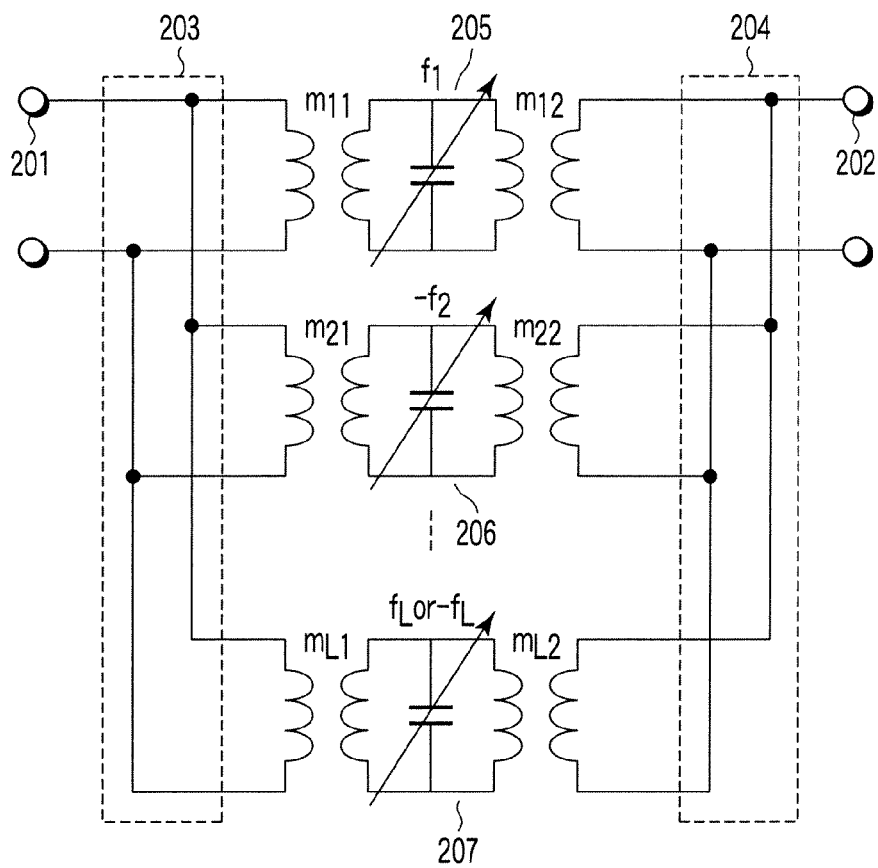
FIG. 6 is an equivalent circuit diagram showing a filter circuit composed of a plurality of resonance circuits connected together in parallel in accordance with an embodiment.

Description will be given of an MEMS (Micro Electro Mechanical System Filter) filter circuit in accordance with an embodiment of the present invention, referring to the drawings as required.

FIG. 1 shows a circuit (referred to as an MEMS circuit) of a filter having an MEMS (Micro Electro Mechanical System) structure in accordance with a first embodiment.

The filter circuit shown in FIG. 1 is composed of four resonators 101 connected together in parallel between an input terminal 104 and an output terminal 105 and having different resonance frequencies $f_1$, $f_2$, $f_3$, and $f_4$. Each of the resonators 101 comprises a control signal generator 102 that generates a control signal. The control signal generator 102 is controlled by a setting signal from a control or setting unit 103. Each resonator 101 is thus set to have predetermined resonance characteristics by the corresponding control signal generator 102.

In the filter circuit shown in FIG. 1, if the resonators 101 are arranged in order of increasing or decreasing resonance frequency ($f_1<f_2<f_3<f_4$ or $f_1>f_2>f_3>f_4$), the odd- and even-numbered resonators 101 are resonated so that output signals from the resonators 101 have phase differences within the range of $(180\pm30)+360\times j$ degrees (j is a natural number). In FIG. 1, to identify the relationship between the phases of output signals from the resonators 101, a sign (−) precedes two of the resonance frequencies fi (i is a natural number). The sign (−) indicates that a phase difference is applied to output signals from the resonator 101 with the sign (−) and the adjacent resonator. In FIG. 1, for convenience, the negative sign (−) precedes each of the even-numbered resonators 101. The phase difference "(180±30)+360×j degrees" is applied to output signals from the even-numbered resonator 101 and the adjacent resonator 101 (odd-numbered resonator 101).

As a specific example, resonance phase can be varied using a combination of a resonator and a 0/180° digital variable phase shifter. In this case, a switching voltage for the variable phase shifter is used as a control signal. The control unit is composed of a voltage generating device. The use of an analog variable phase shifter enables frequency to be varied.

The resonance frequency, resonance phase, and coupling value of each resonator 101 are set by a control signal from the control signal generator 102 depending on a setting signal from the control unit 103. A change in a setting signal from the control unit 103 changes the resonance frequency, resonance phase, and coupling value of the resonator 101, which is then correspondingly operated. Not all of these three parameters (resonance frequency, resonance phase, and coupling value) are changed at once. Instead, only the parameter required for the filter characteristics is changed and provided with a predetermined value.

Since the resonator 101 uses MEMS, which enables resonance characteristics to be varied by external control signals, it can be provided in a semiconductor circuit together with other circuits. The resonator 101 is thus applicable to SOC (System On Chip) or the like in which circuits required for a communication system are built into one semiconductor chip.

FIG. 2 shows the signal passing characteristic of the filter circuit shown in FIG. 1. As shown in FIG. 2, the intervals among the frequencies of output signals from the resonators 101 are determined by the coupling values of the resonators. The intervals can be equalized by appropriately changing the coupling values. If the filter circuit shown in FIG. 1 requires steep filter characteristics, setting unequal frequency intervals enables steep filter characteristics to be provided using a smaller number of resonators 101.

Now, with reference to FIG. 3, description will be given of the operational principle of the filter circuit with the parallel connected resonators shown in FIG. 1. FIG. 3 shows an equivalent circuit of a filter circuit composed of two resonators, that is, the simplest circuit, for the convenience of description.

The filter circuit shown in FIG. 3 is composed of resonators 205 and 206 connected together in parallel between an input terminal 201 and an output terminal 202 and having resonance frequencies $f_1$ and $f_2$, respectively. Couplings in the resonator 205 are made using the same coupling coefficient value ($m_1$), and couplings in the resonator 206 are made using the same coupling coefficient value ($m_2$). Specifically, in the resonator 205 in the filter circuit shown in FIG. 3, the resonator 205 having the resonance frequency $f_1$, the coupling coefficient $m_1$ is used to couple an input-side inductor connected to the input terminal 201 to a first inductor connected to a capacitor, and the coupling coefficient $m_1$ is used to couple an output inductor connected to the output terminal 202 to a second inductor connected to the capacitor. Similarly, in the resonator 206, having the resonance frequency $f_2$, the coupling coefficient $m_2$ is used to couple an input-side inductor connected to the input terminal 201 to a first inductor connected to a capacitor, and the coupling coefficient $m_2$ is used to couple an output inductor connected to the output terminal 202 to a second inductor connected to the capacitor.

In the filter circuit shown in FIG. 3, when an input signal is input to the filter circuits 205 and 206 via the input terminal 201, the filter circuits 205 and 206 output signals having the resonance frequencies $f_1$ and $f_2$. A synthesized output signal is then output from the output terminal 202.

FIG. 4 shows the passing frequency characteristic of the filter circuit shown in FIG. 3 which characteristic is observed if a phase difference of 180° (opposite phases) is applied to between an output signal from the resonator 206 having the resonance frequency $f_2$ and an output signal from the resonator 205 having the resonance frequency $f_1$. FIG. 5 shows the passing frequency characteristic of the filter circuit shown in FIG. 3 which characteristic is observed if a phase difference of 0° (the same phase) is applied to between an output signal from the resonator 206 having the resonance frequency $f_2$ and an output signal from the resonator 205 having the resonance frequency $f_1$.

If the phase difference between output signals from the resonators 205 and 206 is 180°, a frequency characteristic 302 obtained is the sum of frequency responses 303 from the resonators 205 and 206 as shown in FIG. 4. However, if the phase difference between output signals from the resonators 205 and 206 is 0°, a frequency characteristic 304 obtained is the difference between the frequency responses 303 from the resonators 205 and 206 as shown in FIG. 5. The ripple between the frequencies $f_1$ and $f_2$ observed in the frequency response 303, an amount of ripple required for a filter waveform can be obtained by setting the spacing between the frequencies $f_1$ and $f_2$ and mutual couplings $m_1$ and $m_2$ in the resonance circuits 205 and 206. The amount of ripple in a frequency band can thus be adjusted on the basis of the mutual couplings m1 and m2. If a filter circuit is composed of the resonance circuits 205 and 206, the frequency responses from the resonance circuits 205 and 206 can be synthesized to provide the filter circuit with the desired pass band.

FIG. 6 shows an equivalent circuit obtained by generalizing the filter circuit shown in FIG. 1. The filter circuit shown in FIG. 6 is composed of L (integer) resonators 205 to 207 connected together in parallel. In the filter circuit shown in FIG. 6, coupling coefficients $m_{L1}$ and $m_{L2}$ are used to make couplings in resonators 205, 206, and 207 having resonance frequencies $f_1, f_2, \ldots, f_L$ (L is a natural number). Power from the input terminal 201 is distributed to the resonators 205, 206, and 207 by a distribution unit 203. The power having passed through the resonators 205, 206, and 207 is synthesized by a synthesis unit 204 and then output from the output terminal 202.

Figure 7:
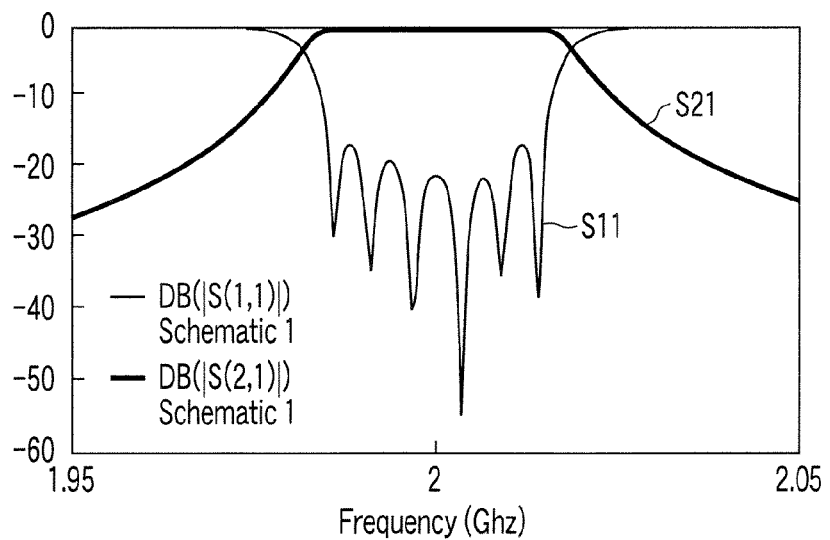
FIG. 7 is a graph showing frequency characteristics obtained, through specific calculations, from the filter circuit shown in FIG. 6.

FIG. 7 shows the passing frequency characteristic S21 and reflection frequency characteristic S11 of the filter circuit observed if the filter circuit shown in FIG. 6 is composed of six (L=6) resonators 205 to 207. To obtain a passing characteristic S21 and a reflection characteristic S11 such as those shown in FIG. 7, the filter circuit uses a 180° ideal electric line and a coupling circuit is composed of a J inverter using three capacitors. The 180° ideal electric line is used to apply a phase difference to output signals from the resonators 205 to 207.

Figure 8:
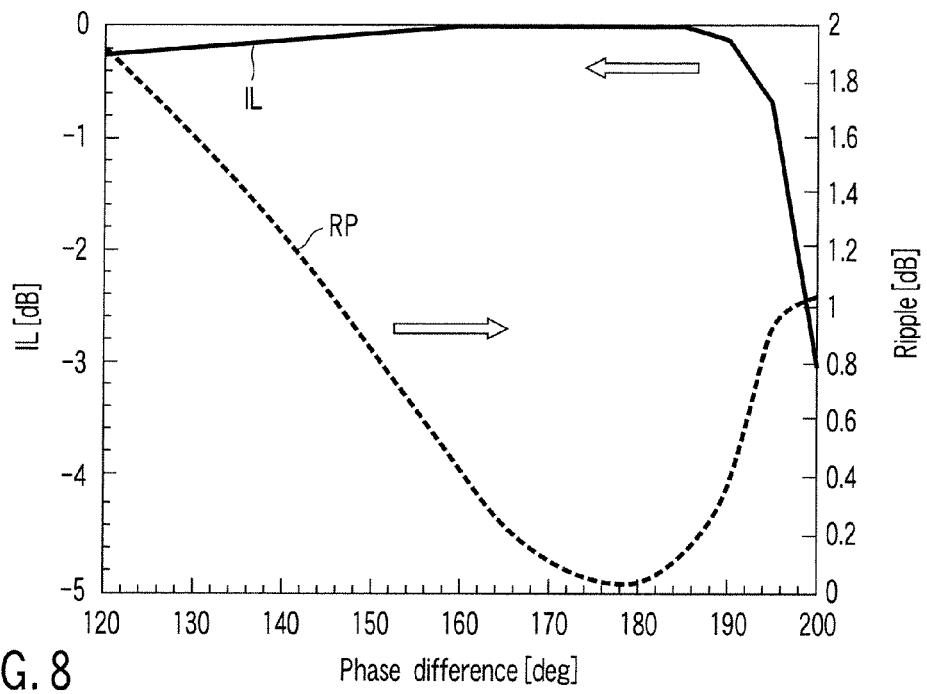
FIG. 8 is a graph showing a characteristic diagram of an insertion loss and a ripple vs. a delay phase angle in the filter circuit shown in FIG. 6.

FIG. 8 shows values for an insertion loss IL and a band ripple RP, included in the filter characteristics, vs. the phase angle of the 180° ideal electric line which is required to provide the phase difference. In general, the filter desirably has an insertion loss IL (actually a reflection loss) of at most 0.1 dB in an ideal circuit. FIG. 8 indicates that the phase difference needs to be within the range of 30°. Since the phase difference may be +30° depending on the position of and the value for the ideal electric line, the preferable phase difference is within the range of ±30°.

Figure 9:
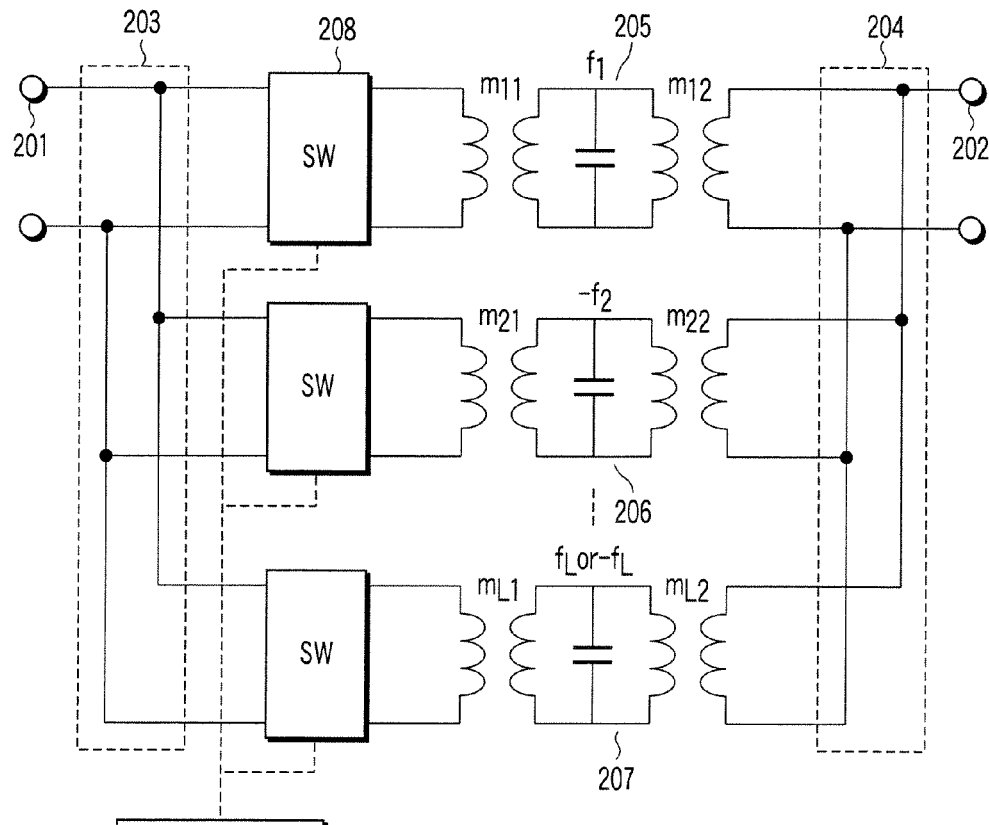
FIG. 9 is a circuit diagram schematically showing a filter circuit in accordance with another embodiment.

FIG. 9 shows an equivalent circuit of a filter circuit in accordance with a second embodiment. In the filter circuit shown in FIG. 9, L resonance circuits 205, 206, and 207 are connected together in parallel between the input terminal 201 and the output terminal 202. A switch 208 is connected between the input terminal 201 and each of the resonators 205, 206, and 207. Each switch 208 is turned on and off by a control signal from the control unit 103. The filter circuit shown in FIG. 9, the resonators 205, 206, and 207, connected together in parallel, can be individually stopped by the switch 208. In the filter circuit shown in FIG. 9, the number of those of the resonators 205, 206, and 207 which perform a resonant operation can be changed by a signal from the control unit 103. The passing characteristic of the filter circuit can be modified by changing the number L of resonators 205, 206, 207.

To stop the resonators 205, 206, and 207, it is only necessary that a signal line has a function for offering an impedance other than one corresponding to a short circuit (the impedance may correspond to an open circuit) and that the control unit 103 can change the number of operative resonators.

Figure 10:
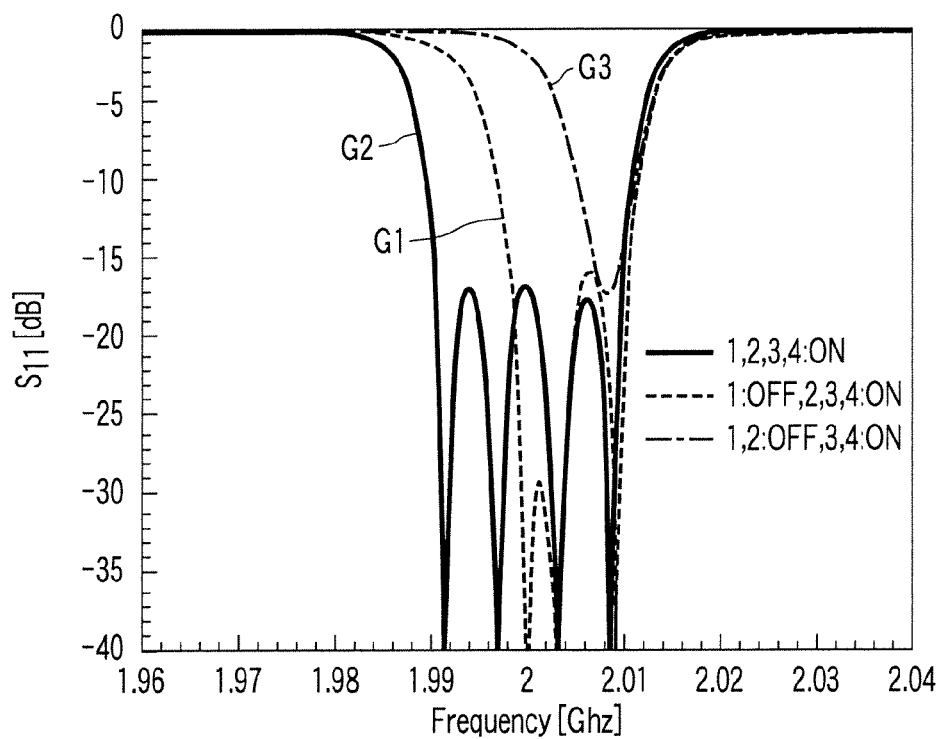
FIG. 10 is a graph showing frequency characteristics obtained, through specific calculations, from the filter circuit shown in FIG. 9.
Figure 11:
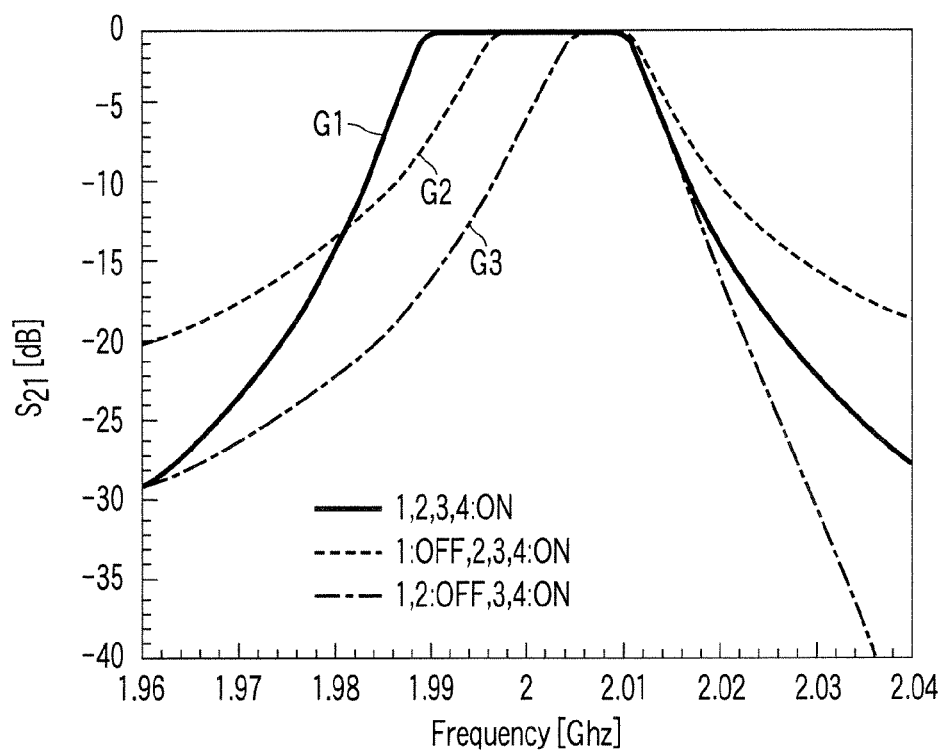
FIG. 11 is a graph showing frequency characteristics obtained, through specific calculations, from the filter circuit shown in FIG. 9.

FIGS. 10 and 11 are graphs showing specific calculations for a filter circuit composed of four (L=4) resonators 205, 206, and 207 and the switches 208 shown in FIG. 8. FIGS. 10 and 11 show the reflection characteristic S11 and passing characteristic S12 of the filter circuit. The resonance frequencies $f_1$, $f_2$, $f_3$, and $f_4$ of the four resonators are set at 1.9880, 1.9957, 2.0042, and 2.0120 GHz, respectively. The coupling value m of each resonator is specified to be 0.0025. In FIGS. 10 and 11, a solid line G1 shows a graph obtained if all four switches 208 are turned on. A broken line G2 shows a graph obtained if the first switch 208 is turned off, whereas the remaining three switches 208 are turned on. An alternate long and short dash line G3 shows a graph obtained if the first and second switches 208 are turned off, whereas the remaining two switches are turned on.

As shown in FIGS. 10 and 11, the filter circuit composed of the four resonators offers a narrower frequency band than a filter circuit composed of six circuits, as is apparent from a comparison with the graphs of the latter filter circuit shown in FIG. 7. Also as shown in FIGS. 10 and 11, the filter circuit with all four switches 208 turned on (graph G1 shown by the solid line) offers a wider frequency band than that with one or two switches 208 turned on (graph G2 or G3 shown by the broken line or alternate long and short dash line). The width of the frequency band gradually decreases with increasing number of switches 208 turned on.

The frequency bandwidth can thus be varied by increasing or reducing the number of resonators 205, 206, 207 operated depending on the signal band passed through the filter. The conventional filter circuit with cascaded resonators requires the coupling coefficient m of each of the resonators to be adjusted in order to vary the frequency bandwidth. That is to say, the conventional filter requires a large number of parameters to be adjusted. However, the filter circuit shown in FIG. 6 requires fewer parameters to be adjusted in order to vary the bandwidth; the number of parameters to be adjusted for this filter is equal to that for a Chevychev filter with k resonators (k/2k+1). This number is much smaller than that for an elliptic function filter or the like which has complicated couplings.

FIG. 12 shows a filter circuit in accordance with a variation of the filter circuit shown in FIG. 9. In the filter circuit shown in FIG. 12, not only a switch 208-1 is connected between the input terminal 201 and each of the resonators 205, 206, and 207 but also a switch 208-2 is connected between the output terminal 202 and each of the resonators 205, 206, and 207. The pair of switches 208-1 and 208-2 connected to each of the resonators 205, 206, and 207 is synchronously turned on and off by control signals from the control unit 103. The filter circuit shown in FIG. 12 enables the resonator 205 to be reliably stopped by the pair of switches 208-1 and 208-2.

Figure 13:
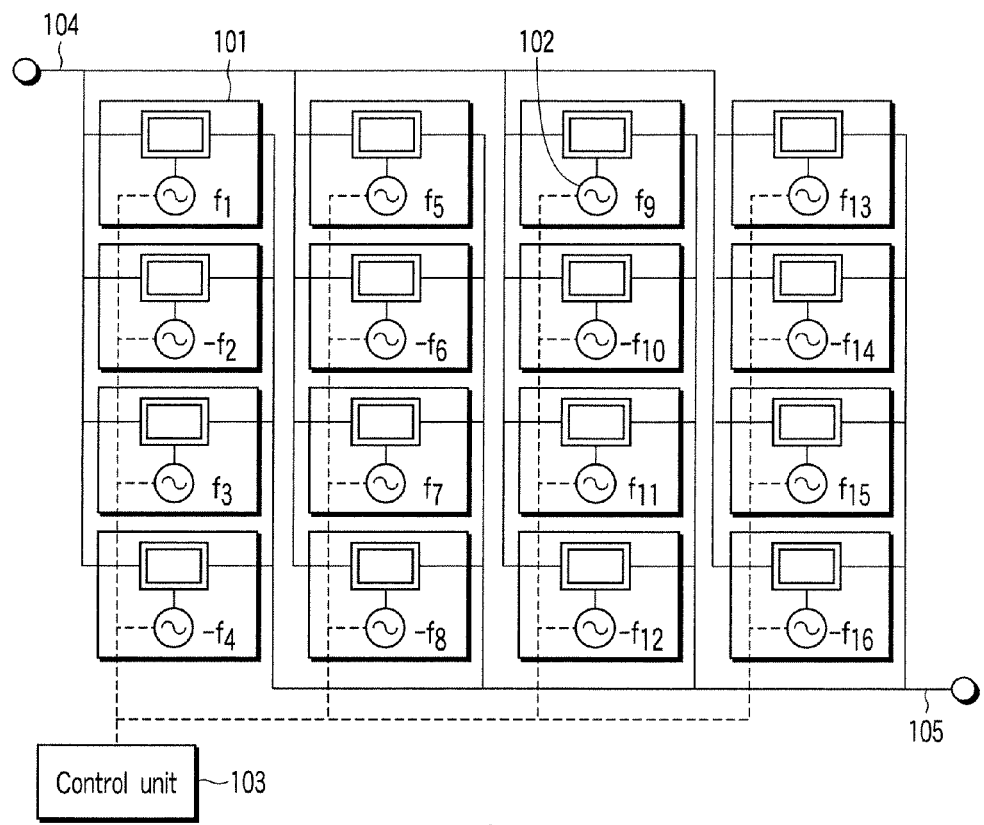
FIG. 13 is a circuit diagram schematically showing a filter circuit in accordance with another embodiment.

FIG. 13 shows a first specific example of the filter circuit shown in FIG. 1. The filter circuit shown in FIG. 13 is composed of 16 resonators 101 each comprising the control signal generator 102. In the filter circuit shown in FIG. 13, a first to fourth parallel circuits are connected together in parallel between the input terminal 104 and the output terminal 105. The first to fourth parallel circuits are composed of four resonators 101 connected together in parallel. Each resonator 101 has its resonance frequency $f_1$ to $f_{16}$, resonance phase, and coupling value set by control signals from the signal control generator 102.

Figure 14:
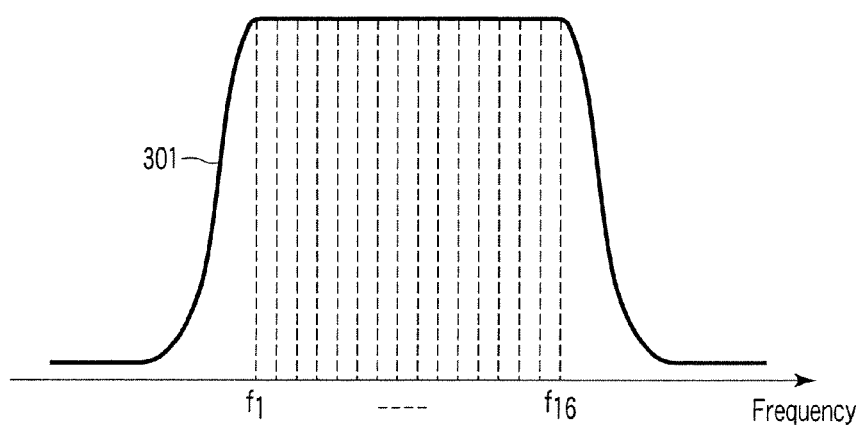
FIG. 14 is a graph showing the frequency response characteristic of the filter circuit shown in FIG. 13.

In the filter circuit shown in FIG. 13, operating all resonators 101 enables the realization of a passing frequency characteristic 301 shown in FIG. 14. The same characteristic can be realized regardless of whether the resonators 101 are arranged in order of increasing or decreasing resonance frequency or randomly.

Figure 15:
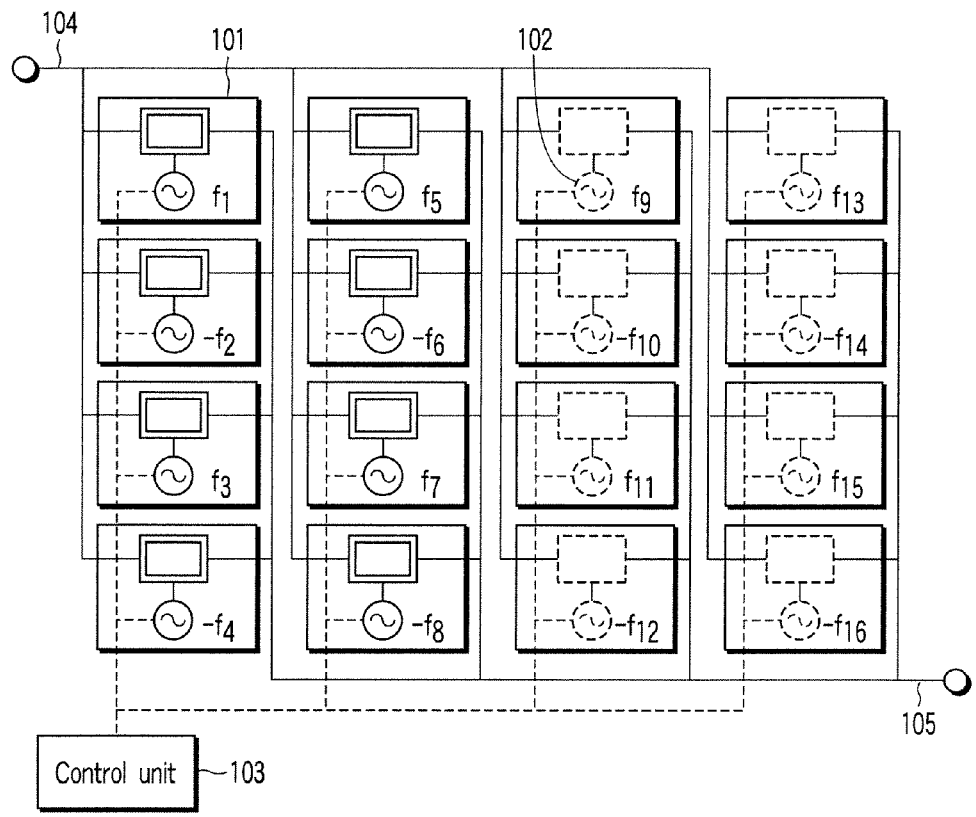
FIG. 15 is a circuit diagram showing an example of an operation of the filter circuit shown in FIG. 13.

FIG. 15 shows an example in which in the filter circuit shown in FIG. 13, the first to eighth resonators 101 (resonators in the first and second parallel circuits), corresponding to half of the 16 resonators, are operated. In the circuit shown in FIG. 15, the operative resonators 101 (resonators in the first and second parallel circuits) are shown by solid lines. Inoperative resonators 101 (resonators in the third and fourth parallel circuits) are shown by broken lines. Each resonator 101 is set in the operative or inoperative by the control unit 103.

Figure 16:
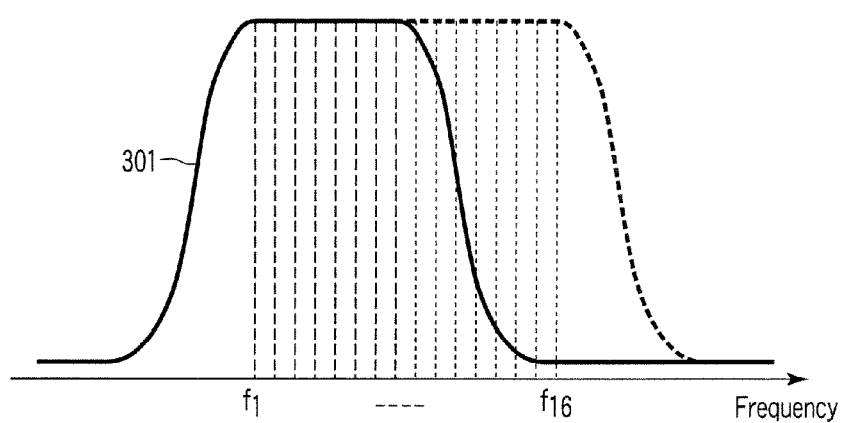
FIG. 16 is a graph showing the frequency response characteristic of the filter circuit shown in FIG. 15.

The filter circuit in which half the resonators, that is, the eight resonators 101 (resonators in the first and second parallel circuits 101), are operated provides a passing frequency characteristic 301 such as the one shown in FIG. 16. In this figure, the solid line shows the frequency characteristic of the filter circuit shown in FIG. 15. The broken line shows a lost curve of the passing frequency characteristic which is obtained if all resonators 101 shown in FIG. 14 are operated. As is apparent from a comparison of FIGS. 14 and 16, the filter circuit shown in FIG. 15 has the frequency characteristic which provides a pass bandwidth substantially half that of the filter circuit shown in FIG. 13.

FIG. 17 shows that in the filter circuit shown in FIG. 13, the fifth to twelfth resonators 101 (resonators 101 in the second and third parallel circuits) are set inoperative as shown by broken lines, while the first to fourth resonators 101 (resonators 101 in the first parallel circuit) and thirteenth to sixteenth resonators 101 (resonators 101 in the third parallel circuit) are operated as shown by solid lines. All resonators are resonated with output signals from the thirteenth to sixteenth resonators 101 (resonators 101 in the fourth parallel circuit) set to have phases opposite to (180°) those output signals from the first to fourth resonators 101 (resonators 101 in the first parallel circuit).

FIG. 18 shows the passing frequency characteristic of the filter circuit operated as shown in FIG. 17. As shown in FIG. 18, the fourth and thirteenth resonators 101 operate in phase. This enables the filter circuit to operate in two different bands. If the resonators cannot be set to operate with opposite phases, the same passing frequency characteristic as that shown in 18 can be provided as shown in FIG. 20 by stopping the fifth to eleventh and sixteenth resonators 101 as shown by a broken line in FIG. 19, while operating the other resonators 101.

Figure 21:
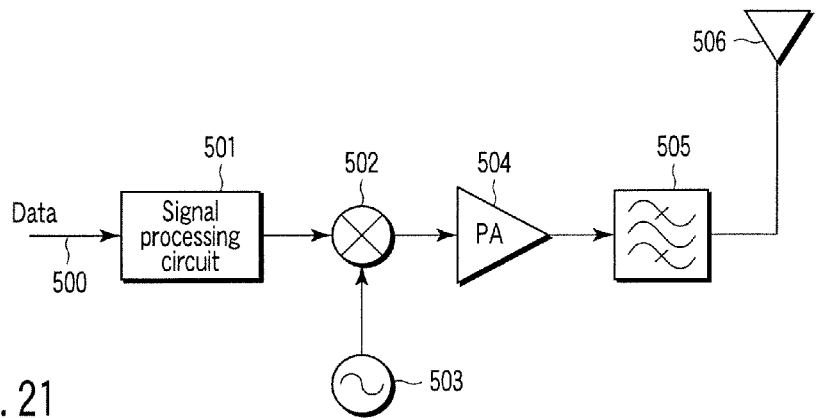
FIG. 21 is a block diagram showing a transmission unit of a radio communication system into which any of the filter circuits shown in FIGS. 1 to 20 is incorporated.
Figure 22:
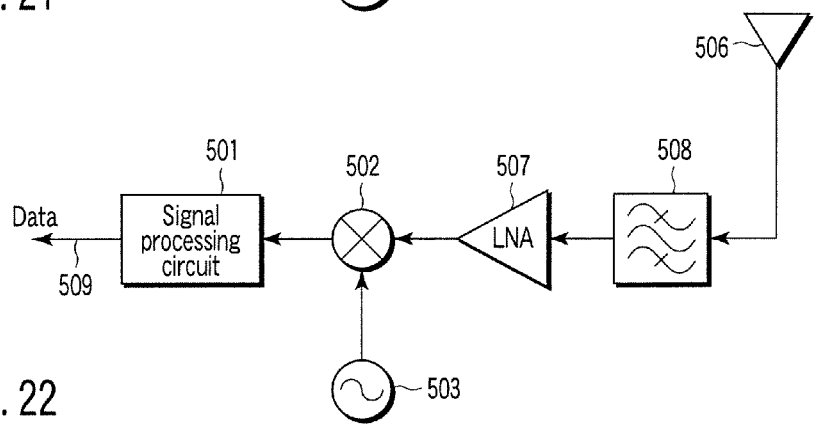
FIG. 22 is a block diagram showing a receiver of a radio communication system into which any of the filter circuits shown in FIGS. 1 to 20 is incorporated.

With reference to FIGS. 21 and 22, description will be given of an example in which the above filter circuit is applied to a radio communication system.

FIG. 21 schematically shows a transmission unit of a radio communication system. Data 500 to be transmitted is input to a signal processing circuit 501, which then executes a digital-analog conversion on the data 500. The resulting data 500 is subjected to a process such as encoding or modulation to generate a transmission signal in a baseband or an intermediate frequency (IF) band. The transmission signal from the signal processing circuit 501 is input to a frequency converter (mixer) 502, which then multiplies the signal by a local signal from a local signal generator 503. The transmission signal thus has its frequency converted into one in a radio frequency (RF) band, that is, the signal is upconverted.

An RF signal output by the mixer 502 is amplified by a power amplifier 504 and then input to a bandpass filter (transmission filter) 505. The signal has its frequency band limited by the filter 505 so as to remove unwanted frequency components. The resulting signal is supplied to an antenna 506. The bandpass filter 505 may be the above described filter circuit.

FIG. 22 schematically shows a receiver of the radio communication system. A signal received by the antenna is input to a bandpass filter (receive filter) 508, which limits the frequency band of the signal to remove unwanted frequency components. The resulting signal is then input to a low noise amplifier 507, which then amplifies and inputs the signal to the mixer 502. The signal is thus multiplied by a local signal so as to have its frequency converted into one in the baseband or intermediate frequency band. The signal from the mixer 502, having a reduced frequency, is input to the signal processing circuit 501, which then demodulates the signal to output receiving data 509. The bandpass filter 508 in the receiver shown in FIG. 22 may be the above described filter circuit.

Figure 23:
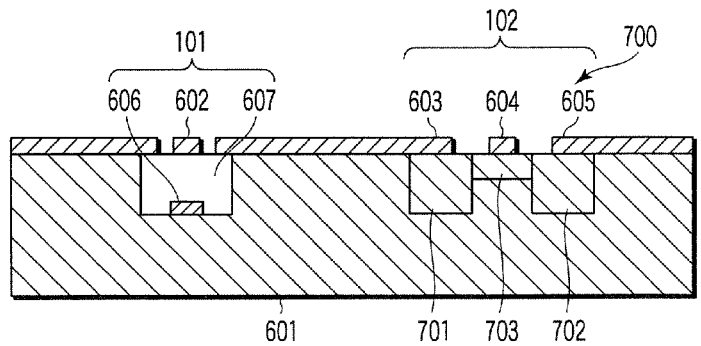
FIG. 23 is a sectional view schematically showing an example of a semiconductor device in which a resonator and a control signal generating unit shown in FIG. 1 are constructed on a semiconductor substrate as an MEMS structure.

The resonators 101 and control signal generators 102, shown in FIG. 1, can be formed on the same semiconductor substrate 601 as shown in FIG. 23. The resonators 101 are formed to have the MEMS structure. Specifically, in each of the resonators 101, a fixed electrode 606 is fixed in a recess 607 formed in a semiconductor substrate 601. A movable electrode 602 is placed in a recess 607 opposite the fixed electrode 606. The movable electrode 602 is supported by a piezoelectric element (not shown) fixedly supported on the semiconductor substrate 601. The piezoelectric element is deformed by a pair of electrodes (not shown) driving the piezoelectric element, to move the movable electrode 602 toward or away from the fixed electrode 606. This results in forming a variable capacitor between the movable electrode 602 and the fixed electrode 606. The variable capacitor is connected to an inductor (not shown) formed on the semiconductor substrate 601 as shown in FIG. 3 or 6 and to the input terminal 201 and output terminal 202 via the inductor.

The pair of electrodes driving the piezoelectric element is connected to a transistor circuit 700 serving as both a voltage source (not shown) and the control signal generator 102. The transistor circuit 700 has, for example, an FET structure having a source area 701 and a drain area 702 formed on the substrate 601. A gate area 703 is formed between the source area 701 and the drain area 702 on the substrate 601. A source electrode 603 and a drain electrode 605 are provided on the source area 701 and the drain area 702, respectively. A gate electrode 604 is placed on and connected to the gate area 703 via a gate oxide film (not shown). The gate electrode 604 is connected to the control unit 103 to operate the transistor structure shown in 23, in accordance with control signals from the control unit 103. A variable voltage from the voltage source is applied to the pair of electrodes driving the piezoelectric element. The piezoelectric element is operated in accordance with the variable voltage applied to the pair of electrodes, to adjust the capacitor between the movable electrode 602 and the fixed electrode 606. The capacitor in the resonance circuit 101 is adjusted to set parameters for the resonance circuit 101. The set parameters operate the resonance circuit 101 as already described.

Figure 24:
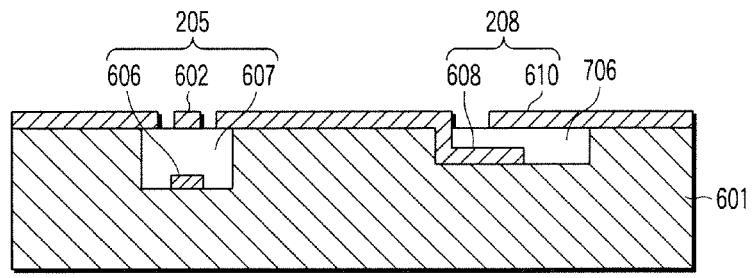
FIG. 24 is a sectional view schematically showing an example of a semiconductor device in which a resonator and a switch shown in FIG. 9 are constructed on a semiconductor substrate as an MEMS structure.

The resonance circuits 205 to 207 and switches 208, shown in FIG. 9, can similarly be formed on the same semiconductor substrate 601 as shown in FIG. 24. The resonance 101 is formed to have the MEMS structure. The MEMS structure of the resonator 205 is similar to the structure shown in FIG. 23 and the description of the resonator 205 is thus omitted. The switch is analogously formed to have the MEMS structure. That is to say, a recess 706 is formed in the substrate 601, and a fixed switch contact 608 is formed in the recess 706. The fixed switch contact 608 is electrically connected to the movable electrode 602 or fixed electrode 606, constituting the resonator 101. A movable terminal 610 is placed in the recess 706 opposite the fixed contact 608. The movable terminal 610 in the switch 208 is supported by a piezoelectric element (not shown) fixedly supported on the semiconductor substrate 601. The piezoelectric element is deformed by a pair of electrodes (not shown) driving the piezoelectric element, to move the movable terminal 610 toward the fixed terminal 608. The Movable terminal 610 is thus electrically and mechanically connected to the fixed terminal 610 to turn on the switch 208. Consequently, a voltage source (not shown) applies a voltage to between the electrodes 602 and 606 in the resonator 205; the voltage source is connected between the movable terminal 610 and one of the electrodes 602 and 606 of in resonator 205. This allows the resonator 205 to operate depending on the capacitor between the movable electrode 602 and the fixed electrode 606. The movable terminal 610 is separated and electrically and mechanically released from the fixed terminal 608 to stop application of a voltage to between the electrodes 602 and 606 in the resonator 101 as well as operation of the resonator 205.

Clearly, not only the filter circuits 505 and 508 but also one or more circuits other than the filter circuits 505 and 508, shown in FIG. 21 or 22, for example, amplification circuits 504 and 507, may be formed on the semiconductor substrate 601, shown in FIGS. 23 and 24; the filter circuits 505 and 508 are formed on the semiconductor substrate 601 by forming the resonators 101 and 205 and the transistor portions 700 or switches 208 on the semiconductor substrate 601. The MEMS structures shown in FIGS. 23 and 24 are only illustrative and may clearly be formed using semiconductor devices of other structures.

When power is distributed to the parallel connected resonance circuits and then synthesized again, signals pass through only one resonance circuit, thus enabling the provision of a low-loss filter circuit. Further, the center frequency or bandwidth of the filter circuit can be varied by adjusting the resonance frequency of each resonator or the number of operative resonators. Accordingly, if the filter circuit is composed of k (integer) resonators, only the k resonators need to be adjusted. This configuration makes it possible to, for example, provide a filter circuit having a center frequency and a bandwidth varying function and thus a low-loss characteristic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A filter circuit comprising:
   input terminals to which an input signal is input;

output terminals which output one of first and second output signals;

first, second and third resonators connected in parallel between the input and output terminals, to which the input signal is supplied and which are resonated at first, second and third resonance frequencies f1, f2, f3 and at predetermined first, second and third resonance phases and output first, second and third resonance signals, respectively, wherein the first and second resonance frequencies f1, f2 are closed to each other, a first phase difference between the first and second resonance phases are set within a range of ($180°\pm30°+360\times n$) (n is an integer), the second and third resonance frequencies f2, f3 are closed to each other, and a second phase difference between the second and third resonance phases are also set within the range of ($180°\pm30°+360\times n$) (n is an integer);

first, second and third switching units which switch the first, second and third resonators between an operative state and an inoperative state, respectively; and a control unit configured to control the first, second and third switching units to switch the first, second and third switching units in the operative state, so that the first, second and third resonance signals are synthesized to generate the first output signal having a relatively flat band, and control the first, second and third switching units to switch the first and third switching units in the operative state and switch the second switching unit in the inoperative state, so that no second resonance signal is generated and the first and third resonance signals are synthesized to generate the second output signal having a notch between the first and second resonance frequencies f1, f2.

2. The filter circuit according to claim 1, further comprising:

signal lines to which the resonators are connected; and impedance units connected to the signal lines;

wherein the control unit controls the switches so as to connect predetermined one or ones of the signal lines to a corresponding impedance unit or units and set the corresponding one or ones of the resonators in the inoperative state, so that the number of the operative resonators being selected.

3. The filter circuit according to claim 2, wherein the impedance units include an open circuit which is to be connected to the resonators.

4. The filter circuit according to claim 1, wherein the input and output terminals, the first, second and third resonators, and the first, second and third switching units are formed on a semiconductor substrate and each of the first, second and third resonators and first, second and third switching units has an MEMS structure.

5. A radio communication device comprising:

a amplifier which amplifies a high frequency signal;

a mixer which carries out frequency conversion;

an antenna; and a filter circuit connected between the amplifier and the mixer and antenna and comprising:

input terminals to which an input signal is input;

output terminals which output one of first and second output signals;

first, second and third resonators connected in parallel between the input and output terminals, to which the input signal is supplied and which are resonated at first, second and third resonance frequencies f1, f2, f3 and at predetermined first, second and third resonance phases and output first, second and third resonance signals, respectively, wherein the first and second resonance frequencies f1, f2 are closed to each other, a first phase difference between the first and second resonance phases are set within a range of ($180°\pm30°+360\times n$) (n is an integer), the second and third resonance frequencies f2, f3 are closed to each other, and a second phase difference between the second and third resonance phases are also set within the range of ($180°\pm30°+360\times n$) (n is an integer);

first, second and third switching units which switch the first, second and third resonators between an operative state and an inoperative state, respectively; and a control unit configured to control the first, second and third switching units to switch the first, second and third switching units in the operative state, so that the first, second and third resonance signals are synthesized to generate the first output signal having a relatively flat band, and control the first, second and third switching units to switch the first and third switching units in the operative state and switch the second switching unit in the inoperative state, so that no second resonance signal is generated and the first and third resonance signals are synthesized to generate the second output signal having a notch between the first and second resonance frequencies f1, f2.

6. The radio communication device according to claim 5, further comprising:

signal lines to which the resonators are connected; and impedance units connected to the signal lines;

wherein the control unit controls the switches so as to connect predetermined one or ones of the signal lines to the corresponding impedance unit or units and set the corresponding one or ones of the resonators in the inoperative state, so that the number of the operative resonators being selected.

7. The radio communication device according to claim 6, wherein the impedance units include an open circuit which is to be connected to the resonators.

8. The radio communication device according to claim 5, wherein the input and output terminals, the first, second and third resonators, and the first, second and third switching units are formed on a semiconductor substrate and each of the first, second and third resonators and first, second and third switching units has an MEMS structure.

* * * * *